United States Patent [19]

Olisar et al.

[11] Patent Number: 4,873,456

[45] Date of Patent: Oct. 10, 1989

[54] HIGH SPEED STATE MACHINE

[75] Inventors: Ronald A. Olisar, Portland; Daniel G. Knierim, Beaverton, both of Oreg.

[73] Assignee: Tektronix, Inc., Beaverton, Oreg.

[21] Appl. No.: 203,036

[22] Filed: Jun. 6, 1988

[51] Int. Cl.[4] .................... H03K 3/284; H03K 3/29
[52] U.S. Cl. ............................ 307/272.1; 307/272.2; 307/440; 307/291; 365/154
[58] Field of Search ................ 307/272.1, 272.2, 290, 307/291, 289, 480, 445, 440; 365/154, 205

[56] References Cited

U.S. PATENT DOCUMENTS

| | | | |
|---|---|---|---|
| 3,783,254 | 1/1974 | Eichelberger | 307/272.1 |
| 4,786,829 | 11/1988 | Letcher | 307/272.1 |
| 4,806,786 | 2/1989 | Valentine | 307/272.1 |

FOREIGN PATENT DOCUMENTS 225075 6/1987 European Pat. Off. .
260418 11/1987 Japan .

OTHER PUBLICATIONS

"Engineering Approach to Digital Design", William Fletcher Prentice-Hall Inc., 1980, pp. 314–325.

Primary Examiner—Stanley D. Miller
Assistant Examiner—Richard Roseen
Attorney, Agent, or Firm—Edward B. Anderson

[57] ABSTRACT

A state element having a pair of parallel-connected, inversely-enabled latches forms the basic state-machine building block. A flip-latch is formed by combining this basic element with a multiplexer for selectively outputting alternate outputs of the latches. A litch-latch is formed by using the basic element alone with the two inputs fed from one of a pair of identical logic elements and feeding back the output from each latch to the logic element from which the input is not received. Other outputs of the logic elements are input into a multiplexer for alternately selecting the outputs from the respective logic elements to be the state machine output. These state elements function similarly to a flip-flop but generally produce less propagation delay and require a lower clocking signal frequency for a given state frequency.

16 Claims, 2 Drawing Sheets

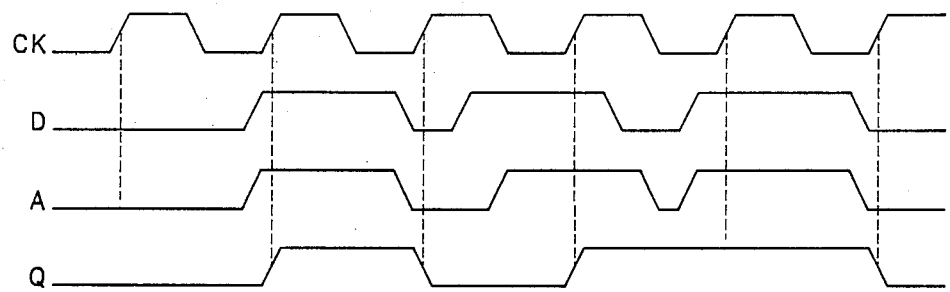
(PRIOR ART) FIG. 7
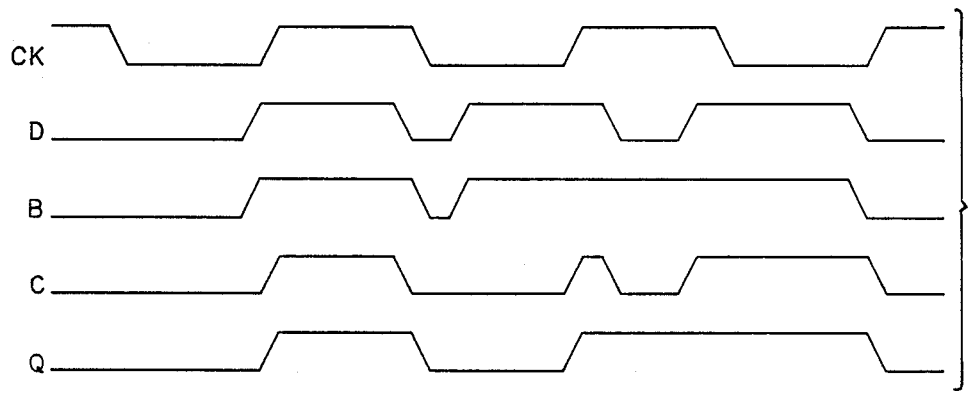
FIG. 8
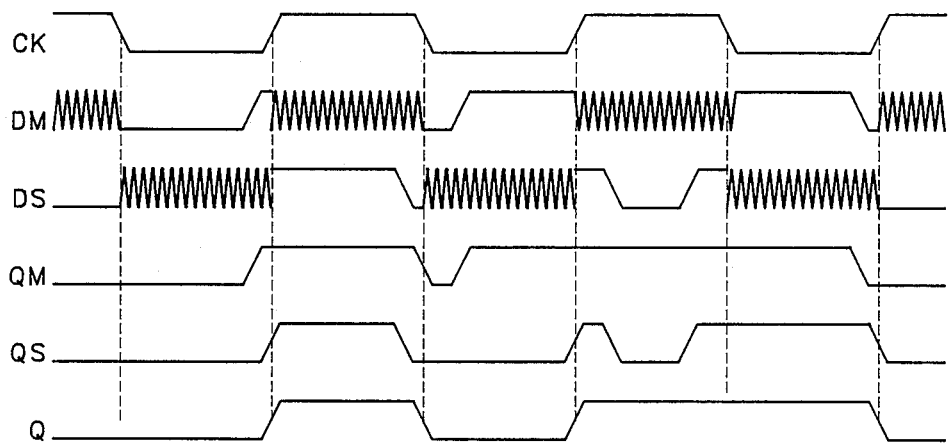
𝍖𝍖𝍖𝍖 =SIGNAL IGNORED      FIG. 9 ent on the page.

HIGH SPEED STATE MACHINE

FIELD OF THE INVENTION

This invention relates to state machines, and more particularly to state elements comprising a pair of parallel-connected, inversely enabled latches.

BACKGROUND OF THE INVENTION

A state machine typically converts a time series of input data through some function into a time series of output data appropriate for subsequent circuits. Typically, state machines include state elements, which store the current state of the machine and logic elements which produce the output and determine the next state as functions of the input and the current state.

A major and critical component in any synchronous state machine is the state element. Conventionally this element is in the form of a master-slave flip-flop. A conventional flip-flop circuit 10 is shown in FIG. 1 wherein a data line shown as conductor D is input into the D-port of a master latch 12. The Q output of master latch 12 is connected via conductor A to the D-port of a slave latch 14, the Q output of which forms the output of flip-flop 10.

A clock signal on conductor CK is inverted prior to input at the enable E-port of latch 12 and input directly into the E-port of latch 14. When the clock signal is low, master latch 12 tracks the D input, but the output is held constant by slave latch 14. On the positive clock edge, the output of master latch 12 is latched at the state of the D input and slave latch 14 passes this new state to the output, Q, causing a state transition. As used herein, an output is latched when held at the state existing on the input when the latch enters the latched mode. This is illustrated in the waveforms of FIG. 7 which relate to the conductors associated with latches 12 and 14 of flip-flop 10.

When the clock returns to a low state, the slave latch holds the current state on the output while the master latch tracks the D input to acquire the next "new state". It can be seen that no state transition occurs at the output on the negative clock edge. Thus, a full clock cycle is required for each output state transition. The clock frequency must therefore be twice that of the maximum frequency of any data line.

FIG. 2 illustrates a conventional flip-flop-based state machine 16. The state rate of this machine is equal to the clock frequency rate. Machine 16 includes a block of flip-flops 20 for storing the current state of the machine, and a logic block 18 which produces the state machine output and determines the next state, both as functions of the machine input and the current state. The Q outputs of flip-flop 20 are fed as inputs to the logic block 18, as are the state machine inputs D. The Z outputs of the logic block 18, which carry the next-state information, are coupled to the D inputs of the flip-flop 20. The Y outputs of logic block 18 serve as the state machine's output. The clocking signal is coupled to flip-flop 20 as shown.

It will be appreciated that this diagram is a generalized diagram in that flip-flop 20 may in fact be comprised of a plurality of flip-flops 10. Further, logic block 18 may be composed of a variety of logic elements which are necessary to provide the logic function for a desired application. Accordingly, several flip-flop outputs and several data connections between logic block 18 and flip-flops 20 may exist in this state machine. Also, some of the outputs of logic block 18 may be internally wired directly from inputs of logic block 18, when the logic functions desired for those outputs are equal to single inputs. Reference to the outputs of a logic block or means as being a function of the inputs includes, therefore, the direct connection of some outputs with inputs.

Flip-flop based state machines require a clock frequency at least two times the highest frequency of any state variable signal. Thus, the frequency limitations of the technology in use, and the high loading typical of clock distribution can cause very high speed logic designs to be limited first by poor clock fidelity.

Another factor often limiting state rates is the total data propagation delay time between state elements. The minimum state cycle time is the data propagation delay time through the logic block plus the data propagation delay time through the state element. (Data propagation delay time through a state element is defined to be the sum of the D to CK set-up time and the CK to Q delay time.) The delay for a flip-flop is roughly two times the propagation delay of each latch, since there are two serially connected latches.

The use of digital to analog converter bit-cell structures incorporating parallel-connected latches clocked at a reduced frequency is used to prevent glitches in the converter output. For instance, see HSIEH et al., "A 12-Bit One-Gword/S GaAs Digital-to-Analog Convertor System", *IEEE Journal of Solid-State Circuits,* Vol. SC-22, No. 6, December 1987, pages 1048–1054. However, such an arrangement has not been used as a state element in a state machine heretofore. Further, a state element design having a propagation delay of only a single latch has not heretofore been provided.

SUMMARY OF THE INVENTION

The present invention provides a state machine which can operate at a higher speed, or alternatively, with a lower system clock rate for a given speed, than conventional flip-flop-based state machines. In its simplest form the state element provided by the present invention comprises a pair of latches connected in parallel with the clocking input to one of the latches being inverted relative to the other. The data is input to both latches and the output is selectively taken from the latch which exists in a latching mode. The outputs of the state elements are selected by a multiplexer which is also clock driven. This state element is referred to herein as a flip-latch.

A second type of state element made according to the present invention, referred to herein as a litch-latch, has the outputs of the two latches connected to the inputs of corresponding ones of substantially identical logic blocks. The outputs of the logic blocks go to the inputs of the respective other ones of the latches. This provides for the inherent selection of the corresponding output of the latch which exists in a latching mode to be processed by the logic function block and then automatically output to the latch which will next be in a latch state. Thus, the feedback loop avoids the propagation delay inherent within the multiplexer. Multiplexers are required for the selecting of appropriate signals based on the state of the clock only for the state machine's outputs.

These new state elements produce a state transition on both clock edge polarities, and hence require a clocking frequency equal to the highest frequency of any state variable signal. This is half the clock frequency of flip-flop-based state machines for the same state rate. Hence, for circuits that are clock limited, flip-latches and litch-latches offer higher state rates, greater fidelity of the clock signal, or both. These and other features and advantages of the present invention will become apparent from a review of the drawings and the following detailed description of the preferred embodiment.

BRIEF DESCRIPTION OF THE DRAWINGS

FIG. 7 illustrates signal flow through the conventional flip-flop of FIG. 1.

FIGS. 8 and 9 correspondingly illustrate signal flows associated with the preferred embodiments of FIGS. 3 and 5, respectively.

DETAILED DESCRIPTION OF THE PREFERRED EMBODIMENTS

Figure 1:
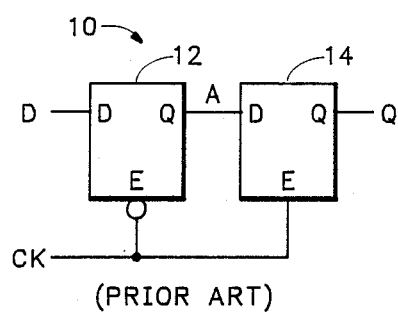
FIG. 1 is a block diagram of a conventional flip-flop.
Figure 2:
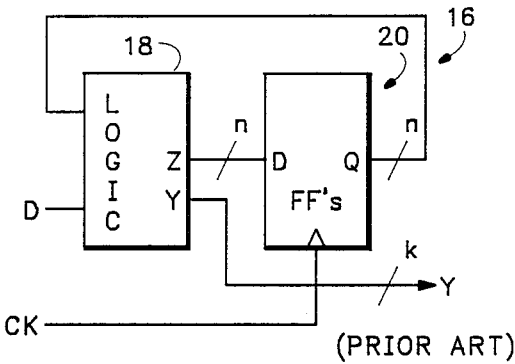
FIG. 2 is a block diagram of a conventional state machine incorporating the flip-flops of FIG. 1.

FIGS. 1, 2 and 7 have been discussed previously with reference to conventional flip-flop structure and use in the Background of the Invention section.

Figure 3:
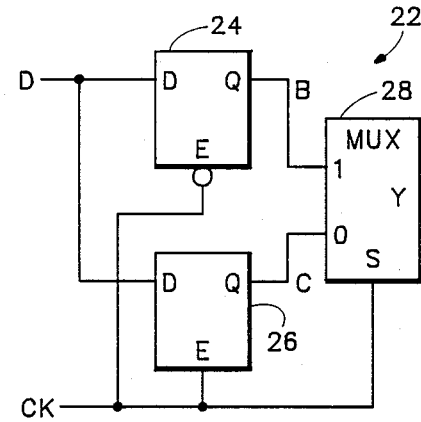
FIG. 3 is a block diagram showing the structure of a state element made according to a first preferred embodiment of the present invention.

Referring now to FIG. 3, what is referred to as a flip-latch state element 22 made according to the present invention, is shown. Flip-latch 22 includes parallel-connected first and second latches 24 and 26. Latch 24 has a clock input which is inverted to its enabling port, as compared to that for latch 26. The two data (D) inputs to the latches are from the single D input. The two Q outputs of latches 24 and 26 on conductors B and C are input to the "1" and "0" inputs, respectively, of a multiplexer 28. The two enabling inputs of latches 24 and 26 and the S select input of multiplexer 28 are connected to the system clock (CK).

When the clock signal is low, the upper latch 24 tracks the D input while the lower latch 26 holds or latches the current state. Output multiplexer 28 selects the output of latch 26 as the flip-latch state output.

On the positive clock edge, latch 24 latches the state of the D input and the multiplexer selects this latch's output as the new state of the flip-latch output, causing a state transition. Also, latch 26 now tracks the D input to acquire the next "new state". The same operation with the roles of latches 24 and 26 reversed causes a state transition on the negative clock edge also.

This operation is illustrated in FIG. 8. The system clock is shown as the first waveform and the data input on conductor D is shown as being the same as in FIG. 7. The latch outputs on conductors B and C are illustrated by correspondingly identified waveforms. The resultant output Q, illustrated as the bottom waveform, is the same as obtained with the flip-flop shown in FIG. 7. However, the clock frequency is one-half that of the clock frequency shown in FIG. 7 since state transitions occur on both positive and negative going edges of the clock signal.

Figure 4:
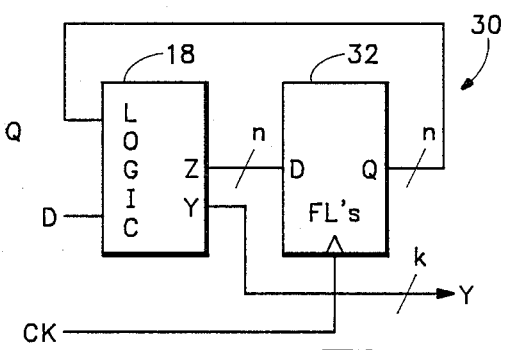
FIG. 4 is a block diagram illustrating a state machine incorporating the state elements of FIG. 3.

A state machine implemented with flip-latches 22 thus has a state rate twice the clock frequency. Such a state machine 30 is shown in FIG. 4. The similarity between this figure and FIG. 2 is apparent. That is, flip-latches may be substituted directly for conventional flip-flops. In FIG. 4, a flip-latch-based state machine 30 may include the same logic block 18 described with reference to FIG. 2, or any other logic block appropriate for a given application. The logic block outputs Z are connected to flip-latches 32 and the outputs Y of the logic block become the state machine outputs. The flip-latch outputs are fed back to inputs to the logic block, as shown. This is all substantially identical to the block diagram structure of FIG. 2. However, the state machine of FIG. 4 has a state rate twice the clock frequency, rather than the same as the clock frequency as was the case with the flip-flop-based state machine 16 of FIG. 2. Flip-latches 32 of FIG. 4 thus represent a direct replacement of the flip-flops 20 represented in FIG. 2.

Figure 5:
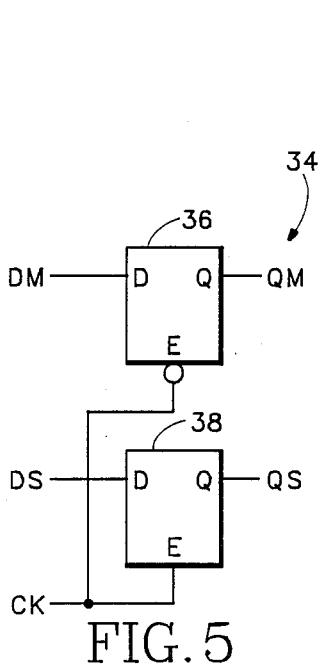
FIG. 5 is a block diagram showing a second preferred embodiment of the present invention.

Referring now to FIG. 5, what is referred to as a litch-latch 34 is illustrated. Litch-latch 34 is formed of two parallel-connected latches 36 and 38 with a clock signal inverted to the enabling port of one of the latches (latch 36) and directly into the enabling port of the other latch (latch 38). This is almost the same as the connection of latches 24 and 26 in FIG. 3. The difference is that the data inputs to latches 36 and 38 are not the same. The data input on a latch 36 is shown as conductor DM for "data master". Correspondingly, the data input for latch 38 is shown on conductor DS for "data slave". The use of the terms master and slave are not here intended to refer to any dependency between the two latches, but rather to distinguish the two latches using terminology applied in the description of a flip-flop.

Similarly, the Q outputs are output on conductors QM and QS for latches 36 and 38, respectively. Litch-latches require the structure of a different state machine, as shown by state machine 40 in FIG. 6. In state machine 40, two substantially identical logic blocks 18 and 18' are used with the set of litch-latches 42. The litch-latch outputs are directly fed back to the second inputs of logic blocks 18 and 18'.

Further, the state machine inputs D are directly fed into both logic blocks. Although the inputs of the logic blocks are shown connected, they may also be connected to separate input signals. The outputs Z of logic blocks 18 and 18' are connected to the opposite data inputs of the litch-latches. That is, the outputs Z of logic block 18' which receives a feedback from the QS outputs are coupled to the DM inputs of litch-latches 42. Correspondingly, the outputs Z of logic block 18 are connected to the DS inputs of litch-latches 42. State machine 40 can thus be seen to require a duplication of the logic block circuitry.

Figure 6:
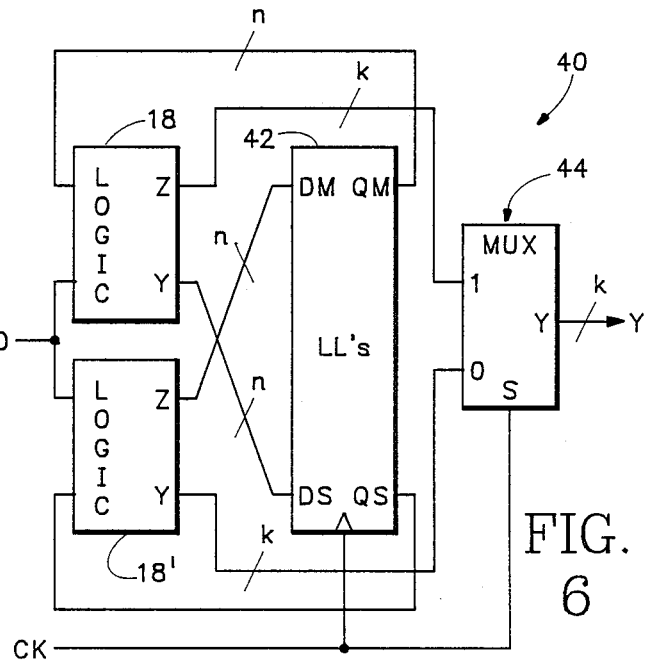
FIG. 6 is a block diagram illustrating a state machine incorporating the state elements of FIG. 5.

Litch-latch 34 operates like flip-latch 22 except that rather than having a multiplexer select which latch output is the litch-latch output, both latch outputs are provided. The state of the litch-latch is defined to be the state of the master latch 36 when the clock signal is high and the state of the slave latch 38 when the clock signal is low. Because of the dual inputs and outputs, the standard state machine design used for flip-flops and flip-latches must be modified as shown in FIG. 6 to use litch-latches as state elements.

With the two identical logic blocks 18 and 18', when the clock level is high, the current data state is held in the master latches, such as latch 36. The logic block connected to the QM output (logic block 18) calculates the next state data, which is applied to the D-ports of the slave latches, such as latch 38.

When the clock level goes low, the slave latches 38 hold this new state and the second logic block 18' calculates the next new state to apply to the inputs of the master latches 36. A multiplexer 44 selects appropriate outputs Y of logic blocks 18 and 18' for state machine outputs based on the level of the clock signal. Thus, it can be seen that the feedback signal is directly connected between the appropriate master or slave latch and logic block. There is thus no multiplexing required to connect a given feedback signal to the appropriate latch input after passing through the logic circuitry.

The operation of litch-latch 34 is illustrated in FIG. 9. In this case, the data are input alternately on the DM and DS lines according to the state of the clock signal, while the input not accepting data can be in either state, i.e. it is a "don't care". The QM and QS outputs can be seen to be the same as the B and C outputs, respectively, from latches 24 and 26 of flip-latch 22. The defined state Q of the litch-latch 34 is equal to the state of QM when CK is high and QS when CK is low. The state of the litch-latch is seen to be identical the Q output of the flip-latch 22.

In summary, flip-latches 22 and litch-latches 34 provide a state element usable in state machines for providing state machines with higher state rates, or alternatively, lower clock frequencies, or both. Further, the data propagation delay of flip-latch 22 is roughly the delay through a latch 24 or 26 and the delay through multiplexer 28. Since delay times of multiplexers are usually less than or equal to delay times of comparable latches, a flip-latch also has slightly less delay than a flip-flop. The data propagation delay for litch-latch 34 is the propagation delay of a single latch 36 or 38. Thus litch-latch 34 has approximately only half the delay of flip-flops or flip-latches. Thus, the invention also allows faster state rates for state machines that are delay limited.

Flip-latches and litch-latches can be intermixed easily in a state machine design, as represented in FIGS. 4 and 6. Any output of a flip-latch can be connected to a litch-latch by tying it to both the DM and DS inputs of the litch-latch. Any litch-latch output pair can also be converted to a single line for a flip-latch input by using a multiplexer to select the appropriate output based on the current level of the clock signal.

Both of these new schemes require additional elements to implement a given state machine compared to the flip-flop-based prior art. Flip-latches contain extra multiplexers and litch-latches require duplicate logic blocks. However, this is much less overhead than is required by the prior art techniques for increasing the speed by adding additional pipeline stages (requiring additional state elements), especially for high speed machines that are already heavily pipelined.

It will be understood by those skilled in the art, that although the invention has been described with reference to the foregoing preferred embodiments, variations in detail may be made in the preferred embodiments without varying from the spirit and scope of the invention as defined in the claims. For instance, the logic blocks 18 and 18' may differ slightly if part of the functionality of the state-machine 40 is not required to operate at the maximum state rate. In this case, any functionality provided in one logic block but not the other would be operative only every other state cycle.

We claim:

1. A state machine for generating output signals having states which are a function of the current and previous states of the input signals, with the state machine being controlled by a system clock signal, said state machine comprising:

at least one pair of latches, each pair comprising:

a first latch means having a first input port means, a first output port means and a first enabling port means coupled to the system clock signal, the signal level on said first input port means being transferred to said first output port means while the signal on said first enabling port means is at a first state, and the signal level on said first output port means being latched while the signal on said first enabling port means is at a second state; and a second latch means having a second input port means, a second output port means, and a second enabling port means coupled to the system clock signal, the signal level on said second input port means being transferred to said second output port means while the signal on said second enabling port means is at the second state, and the signal level on said second output port means being latched while the signal on said second enabling port means is at the first state; and a logic means having a pair of logic input port means and a pair of logic output port means wherein the levels of the signals on said logic output port means are predetermined logic functions of the levels of the signals on said two logic input port means, a first of said logic input port means being coupled to receive the state machine input signals, and the first of said logic output port means forming the state machine output signals;

the second of said logic input port means being coupled to said first and second output port means of each of said pair(s) of latches; and the second of said logic output port means being coupled to said first and second input port means of each of said pair(s) of latches.

2. A state machine according to claim 1 further comprising a multiplexing means having two mux input port means, a mux output port means and a mux select port means receiving the system clock signal for outputting the signals of a first of said two mux input port means when the clock signal is at the first level and outputting the signals of the second of said two mux input port means when the clock signal is at the second level; and wherein said first and second output port means of each of said pair(s) of latches are coupled to said second logic input port means through said multiplexing means, said first mux input port means is coupled to said second latch output port means, said second mux input port means is coupled to said first latch output port means, said mux output port means is coupled to said second logic input port means, and said first logic output port means directly forms the state machine output.

3. A state machine according to claim 2 wherein said first and second input port means of each latch pair are coupled to receive the same signal from said second logic output port means.

4. A state machine according to claim 1 wherein said first and second latch output port means are coupled directly to said second logic input port means.

5. A state machine according to claim 4 wherein said logic means comprises two logic blocks, each logic block having two input port means and two output port means, and said first logic output port means of said logic means comprises said first output port means of said two logic blocks;

said first input port means of each logic block being coupled to the state machine input signals;

the second input port means of one logic block being coupled to said first output port means of each of said latch pair(s) and said second input port means of said other logic block being coupled to said second output port means of each of said latch pair(s); and said second output port means of said one logic block being coupled to said second input port means of each of said latch pair(s) and said second output port means of said other logic block being coupled to said first input port means of each of said latch pair(s).

6. A state machine according to claim 5 wherein said two logic blocks are substantially identical.

7. A state machine according to claim 5 wherein said first output port means of said two logic blocks are coupled to a multiplexing means for selecting the state machine outputs from said logic blocks according to the state of the system clock.

8. A state machine according to claim 7 wherein said two logic blocks are substantially identical.

9. In a state machine for generating output signals having states which are a function of the current and previous states of the input signals, with the state machine being controlled by a system clock signal, said state machine comprising a logic means having a pair of logic input port means and a pair of logic output port means wherein the states of the signals on the logic output port means are predetermined logic functions of the states of the signals on the two logic input port means, a first of the logic input port means being coupled to receive the state machine input signals and a first of the logic output port means forming the state machine output signals; at least one high speed state element comprising:

a first latch means having a first input port means, a first output port means, and a first enabling port means coupleable to the system clock signal, the signal level on said first input port means being transferred to said first output port means while the signal on said first enabling port means is at a first state, and the signal level on said first output port means being latched while the signal on said first enabling port means is at a second state; and a second latch means having a second input port means, a second output port means, and a second enabling port means coupleable to the system clock signal, the signal level on said second input port means being transferred to said second output port means while the signal on said second enabling port means is at the second state, and the signal level on said second output port means being latched while the signal on said second enabling port means is at the first state; and multiplexing means having two mux input port means, a mux output port means and a mux select port means coupleable to the system clock signal for outputting the signals of a first of said two mux input port means when the clock signal is at a first level and outputting the signals of the second of said two mux input port means when the clock signal is at a second level;

said first mux input port means being coupled to said second latch output port means and said second mux input port means being coupled to said first latch output port means;

said mux output port means being coupleable to the second one of the logic input port means; and said first and second latch input port means being coupleable to the second of the logic output port means.

10. In a state machine for generating output signals having states which are a function of the current and previous states of the input signals, with the state machine being controlled by a system clock signal, the state machine comprising logic means having a pair of logic input port means and a pair of logic output port means wherein the levels of the signals on the logic output port means are predetermined logic functions of the levels of the signals on the two logic input port means, a first of the logic input port means being coupled to receive the state machine input signals, the signals on a first of the logic output port means forming the state machine output signals; at least one high speed state element comprising:

a first latch means having a first input port means, a first output port means, and a first enabling port means coupleable to the system clock signal, the signal level on said first input port means being transferred to said first output port means while the signal on said first enabling port means is at a first state, and the signal level on said first output port means being latched while the signal on said first enabling port means is at a second state; and a second latch means having a second input port means, a second output port means, and a second enabling port means coupleable to the system clock signal, the signal level on said second input port means being transferred to said second output port means while the signal on said second enabling port means is at the second state, and the signal level on said second output port means being latched while the signal on said second enabling port means is at the first state;

said first and second latch input port means being coupleable to the second of the logic output port means; and said first and second latch output port means being coupleable to the second one of the logic input port means.

11. In a state machine according to claim 10 wherein the logic means comprises two logic blocks, each logic block having two input port means and two output port means, the first input port means of each logic block being coupled to the state machine input signals; and the first logic output port means of said logic means comprising the first output port means of the two logic blocks; at least one of said state elements wherein said first output port means of each of said state elements is coupleable to the second input port means of one of the logic blocks; said second output port means of said state elements is coupleable to the second input port means of the other of the logic blocks; said second input port means of each of said state elements is coupleable to the second output port means of the one logic block;

and said first input port means of each of said state elements is coupleable to the second output port means of the other logic block.

12. A method for operating a state machine comprising:

inputting state machine input signals into input port means of logic means;

inputting signals output from the logic means into an input port means of a pair of latch means, each of the two latch means being enabled by a different level of a clock signal;

inputting a plurality of outputs of the pair of latch means into a second input port means of the logic means;

outputting at least a portion of the outputs of the logic means as a plurality of state machine outputs; and clocking both of the latch means such that one is enabled while the other is latched.

13. A method according to claim 12 further comprising inputting the outputs of the pair of latch means into an input port means of a multiplexing means and inputting an output of the multiplexing means into the second input port means of the logic means, wherein the outputs of the latch means are input into the logic means through the multiplexing means, the multiplexing means being controlled by the clock signal.

14. A method according to claim 12 wherein the state machine input signals are input into one input port means of each of a pair of logic blocks forming the logic means; the outputs of both of the latch means are input into the other inputs of different ones of the pair of logic blocks; and outputs of the pair of logic blocks are input into the input port means of the latch means of the pair of latch means which is different than the latch means which has outputs coupled to the logic blocks.

15. A method according to claim 14 wherein both logic blocks of the pair of logic blocks are substantially identical.

16. A method according to claim 14 further comprising inputting outputs of the pair of logic blocks into input port means of multiplexing means, and outputting selected inputs of the multiplexing means as state machine outputs according to the state of the system clock.

* * * * *